United States Patent
Yu

(10) Patent No.: US 6,432,763 B1
(45) Date of Patent: Aug. 13, 2002

(54) FIELD EFFECT TRANSISTOR HAVING DOPED GATE WITH PREVENTION OF CONTAMINATION FROM THE GATE DURING IMPLANTATION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/809,133

(22) Filed: Mar. 15, 2001

(51) Int. Cl.[7] .................................. H01L 21/8238
(52) U.S. Cl. ................ 438/217; 438/146; 438/163; 438/291; 257/412
(58) Field of Search ................... 438/224, 231, 438/307, 199, 216, 217, 223, 230, 301, 303, 306, 197, 291, 146, 163, 194; 257/410, 411, 412, 413

(56) References Cited

U.S. PATENT DOCUMENTS

| | | | | |
|---|---|---|---|---|
| 5,716,862 A | * | 2/1998 | Ahmad et al. ............... | 437/41 |
| 5,998,289 A | * | 12/1999 | Sagnes ...................... | 438/592 |
| 6,117,719 A | * | 9/2000 | Luning et al. .............. | 438/230 |
| 6,124,621 A | * | 9/2000 | Lin et al. ................... | 257/412 |
| 6,200,866 B1 | * | 3/2001 | Ma et al. .................... | 438/299 |
| 6,258,645 B1 | * | 7/2001 | Kang ......................... | 438/224 |
| 6,262,458 B1 | * | 7/2001 | Hu ............................. | 257/384 |
| 6,326,250 B1 | * | 12/2001 | Ahmad et al. ............. | 438/197 |

OTHER PUBLICATIONS

Yin et al. U.S. patent application Publication US 2001/0028095 A1; Pub. Date: Oct. 2001.*

Lin et al. Patent application Publication US 2001/0030349 A1.*

* cited by examiner

Primary Examiner—Wael Fahmy
Assistant Examiner—Fernando Toledo
(74) Attorney, Agent, or Firm—Monica H. Choi

(57) ABSTRACT

For fabricating a field effect transistor on a semiconductor substrate, a gate dielectric of the field effect transistor is formed on a semiconductor substrate. A doped gate electrode, which may be comprised of silicon germanium (SiGe) for example, is formed on the gate dielectric. An amorphous semiconductor structure, which may be comprised of amorphous silicon for example, is formed on the doped gate electrode. A hardmask structure comprised of a hardmask dielectric material is formed on the amorphous semiconductor structure. The gate dielectric, the doped gate electrode, the amorphous semiconductor structure, and the hardmask structure form a gate stack. Liner dielectric structures are formed on sidewalls of the gate stack. A dopant is implanted into exposed regions of the semiconductor substrate after forming the liner dielectric structures on the sidewalls of the gate stack. For example, halo dopant may be implanted at an angle toward the sidewalls of the gate stack for forming halo regions of the field effect transistor. In this manner, the liner dielectric structures on the sidewalls of the gate stack prevent bombardment of implantation ions against the sidewalls of the doped gate electrode to prevent contamination of the implantation chamber. In addition, the amorphous semiconductor structure on top of the doped gate electrode prevents out-diffusion of the germanium from the doped gate electrode since germanium substantially does not diffuse through amorphous silicon. The hardmask structure on the amorphous silicon structure prevents bombardment of implantation ions against the top of a semiconductor material of the gate stack to further prevent contamination of the implantation chamber.

14 Claims, 5 Drawing Sheets

US 6,432,763 B1

FIELD EFFECT TRANSISTOR HAVING DOPED GATE WITH PREVENTION OF CONTAMINATION FROM THE GATE DURING IMPLANTATION

Technical Field

The present invention relates generally to fabrication of field effect transistors having scaled-down dimensions, and more particularly, to a process for fabricating a field effect transistor having a doped gate electrode, such as a silicon germanium (SiGe) gate electrode for example, with prevention of contamination of an implantation chamber from the bombardment of the implantation ions with the gate electrode.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

As the dimensions of the MOSFET 100 are further scaled down to tens of nanometers, short channel effects are more likely to disadvantageously affect the operation of the MOSFET 100, as known to one of ordinary skill in the art of integrated circuit fabrication. Referring to FIG. 1, to prevent short channel effects as the dimensions of the MOSFET 100 are further scaled down, halo regions 105 and 107 are formed by the drain extension junction 104 and the source extension junction 106 in the semiconductor substrate 102. A drain halo region 105 is formed by the drain extension junction 104, and a source halo region 107 is formed by the source extension junction 106.

The halo regions 105 and 107 are implanted with a halo dopant that is opposite in type to the dopant within the drain and source extension junctions 104 and 106. For example, when the drain and source extension junctions 104 and 106 are implanted with an N-type dopant for an NMOSFET (N-channel Metal Oxide Semiconductor Field Effect Transistor), the halo regions 105 and 107 are implanted with a P-type dopant for preventing short channel effects of the NMOSFET. On the other hand, when the drain and source extension junctions 104 and 106 are implanted with a P-type dopant for a PMOSFET (P-channel Metal Oxide Semiconductor Field Effect Transistor), the halo regions 105 and 107 are implanted with an N-type dopant for preventing short channel effects of the PMOSFET. Such halo regions 105 and 107 are known to one of ordinary skill in the art of integrated circuit fabrication.

As the dimensions, including the thickness (i.e., the height), of the gate electrode 118 are further scaled down, resistance of the gate electrode 118 may limit the device speed of the MOSFET 100. To minimize resistance of the gate electrode, the gate electrode 118 is formed with a doped semiconductor material such as silicon doped with germanium instead of just polysilicon. For example, the gate electrode 118 is comprised of silicon germanium (SiGe) having a germanium concentration in a range of from about 10 atomic percent to about 60 atomic percent.

Such a silicon germanium gate electrode 118 is advantageous because an N-type or P-type dopant has a higher activation rate within silicon germanium (than in just polysilicon), as known to one of ordinary skill in the art of integrated circuit fabrication, to minimize the resistance of the silicon germanium gate electrode 118. In addition, a silicon germanium gate electrode 118 effectively suppresses diffusion of an N-type or P-type dopant, such as boron for example, from the silicon germanium gate electrode 118 into the gate dielectric 116 and the semiconductor substrate 102. Such diffusion of dopant from the gate electrode 118 into the gate dielectric 116 and the semiconductor substrate 102 disadvantageously affects the threshold voltage of the MOSFET 100.

Referring to FIG. 2, to further enhance the control of the electrical characteristics of a MOSFET as the dimensions of the MOSFET are scaled down, a MOSFET (Metal Oxide Semiconductor Field Effect Transistor) 150 is fabricate in SOI (semiconductor on insulator) technology. In SOI technology, a layer of buried insulating material 132 is deposited on the semiconductor substrate 102. The layer of buried insulating material 132 is typically comprised of silicon dioxide ($SiO_2$) when the semiconductor substrate 102 is comprised of silicon. In addition, a thin silicon film 134 is deposited on the layer of buried insulating material 132.

A gate dielectric 136 and a gate electrode 138 are formed on the thin silicon film 134. A drain and source dopant is implanted into exposed regions of the thin silicon film 134 to form a drain 142 and a source 144 of the MOSFET 150. A channel region of the MOSFET 150 is the portion of the thin silicon film 134 disposed between the drain 142 and the source 144 and disposed below the gate dielectric 136. The silicon film 134 is relatively thin having a thickness in a range of from about 5 nanometers to about 20 nanometers for example. Thus, the channel region of the MOSFET 150 is fully depleted during operation of the MOSFET 150 with improved control of electrical characteristics of the MOSFET 150, as known to one of ordinary skill in the art of integrated circuit fabrication. Thus, the fully depleted channel region of the MOSFET 150 formed in SOI technology minimizes undesired short-channel effects, as known to one of ordinary skill in the art of integrated circuit fabrication.

The silicon film 134 is typically not doped such that the channel region of the MOSFET 150 between the drain 142 and the source 144 is fully depleted during operation of the MOSFET 150. However, the threshold voltage of the MOSFET 150 may be difficult to adjust without doping the channel region of the MOSFET 150. In that case, using silicon germanium for the gate electrode 138 is advantageous for adjusting the threshold voltage of the MOSFET 150. The concentration of germanium within the gate electrode 138 is adjusted in a range of from about 10 atomic percent to about 60 atomic for affecting the threshold voltage of the MOSFET 150.

Despite such advantages of using silicon germanium for the gate electrode 118 or 138, the germanium from the gate electrode 118 or 138 may contaminate an ion implantation chamber. Referring to FIG. 3 for example, during formation of the halo regions 105 and 107, a halo dopant is implanted at an angle toward the sidewalls of the silicon germanium gate electrode 118 or 138. Angled implantation processes are known to one of ordinary skill in the art of integrated circuit fabrication. Implantation ions comprising the halo dopant bombard the top surface and the sidewalls of the silicon germanium gate electrode 118 or 138 such that pieces of silicon germanium are chipped off from the gate electrode 118 or 138 to disadvantageously contaminate the implantation chamber.

Thus, a mechanism for fabricating a field effect transistor with a doped gate electrode without contaminating the implantation chamber is desired.

SUMMARY OF THE INVENTION

Accordingly, in a general aspect of the present invention, a doped gate electrode, such as a silicon germanium gate electrode, is formed with liner dielectric structures at the sidewalls of the doped gate electrode and with an amorphous semiconductor structure and a hardmask structure on top of the doped gate electrode. Such structures prevent bombardment of implantation ions with the doped gate electrode during an implantation process to prevent contamination of the implantation chamber.

In one embodiment of the present invention, for fabricating a field effect transistor on a semiconductor substrate, a layer of gate dielectric material is deposited on the semiconductor substrate, a layer of doped gate electrode material is deposited on the layer of gate dielectric material, a layer of amorphous semiconductor material is deposited on the layer of doped gate electrode material, and a layer of hardmask dielectric material is deposited on the layer of amorphous semiconductor material. A masking material is patterned to form a masking structure, and any portion of the layer of hardmask dielectric material, the layer of amorphous semiconductor material, the layer of doped gate electrode material, and the layer of gate dielectric material, not under the masking structure, are etched away.

The hardmask dielectric material remaining under the masking structure forms a hardmask structure. The amorphous semiconductor material remaining under the hardmask structure forms an amorphous semiconductor structure. The doped gate electrode material remaining under the amorphous semiconductor structure forms a doped gate electrode of the field effect transistor. The gate dielectric material remaining under the doped gate electrode forms a gate dielectric of the field effect transistor. The gate dielectric, the doped gate electrode, the amorphous semiconductor structure, and the hardmask structure form a gate stack.

The masking structure is removed from top of the hardmask structure. Liner dielectric structures are formed on sidewalls of the gate stack. A dopant is implanted into exposed regions of the semiconductor substrate after forming the liner dielectric structures on the sidewalls of the gate stack.

The present invention may be used to particular advantage when the doped gate electrode material is comprised of silicon doped with germanium having a germanium concentration in a range of from about 10 atomic percent to about 60 atomic percent, when the layer of amorphous semiconductor material is comprised of amorphous silicon, and when the hardmask material is comprised of silicon nitride ($Si_3N_4$). In addition, the liner dielectric structures may be comprised of silicon dioxide ($SiO_2$) having a thickness in a range of from about 100 angstroms to about 200 angstroms. In that case, the liner dielectric structures are advantageously formed from a CVD (chemical vapor deposition) process using a temperature of less than about 400° Celsius to prevent recrystallization of the amorphous silicon.

In this manner, the liner dielectric structures on the sidewalls of the gate stack prevent bombardment of implantation ions against the sidewalls of the doped gate electrode to prevent contamination of the implantation chamber. In addition, the amorphous semiconductor structure on top of the doped gate electrode prevents out-diffusion of the germanium from the doped gate electrode since germanium substantially does not diffuse through amorphous silicon. The hardmask structure on the amorphous silicon structure prevents bombardment of implantation ions against the top of a semiconductor material of the gate stack to further prevent contamination of the implantation chamber.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and function.

DETAILED DESCRIPTION

An example embodiment of the present invention is described for forming a doped gate electrode of a MOSFET with a semiconductor substrate. However, the present invention may also be applied for forming a doped gate electrode of a MOSFET when the semiconductor substrate is a semiconductor film deposited on a buried insulating layer in SOI (semiconductor on insulator) technology, as would be apparent to one of ordinary skill in the art of integrated circuit fabrication from the description herein.

Figure 1:
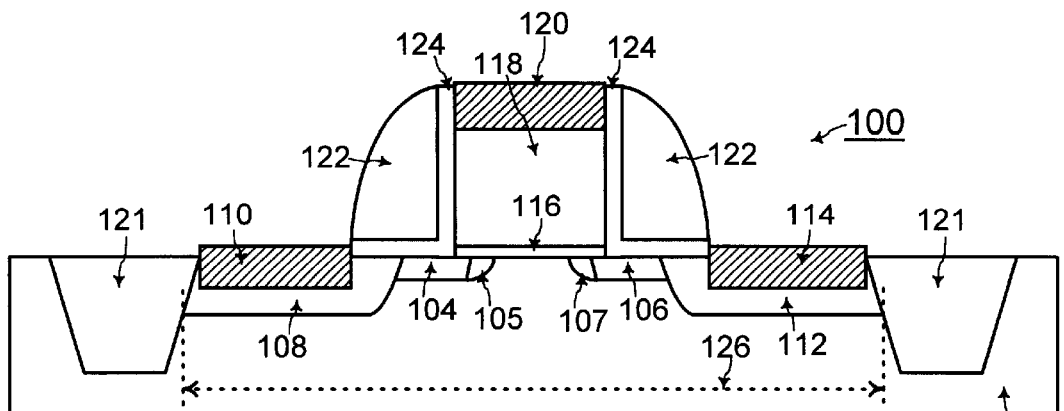
FIG. 1 shows a cross-sectional view of a conventional MOSFET (Metal Oxide Semiconductor Field Effect Transistor) formed within a semiconductor substrate.
Figure 2:
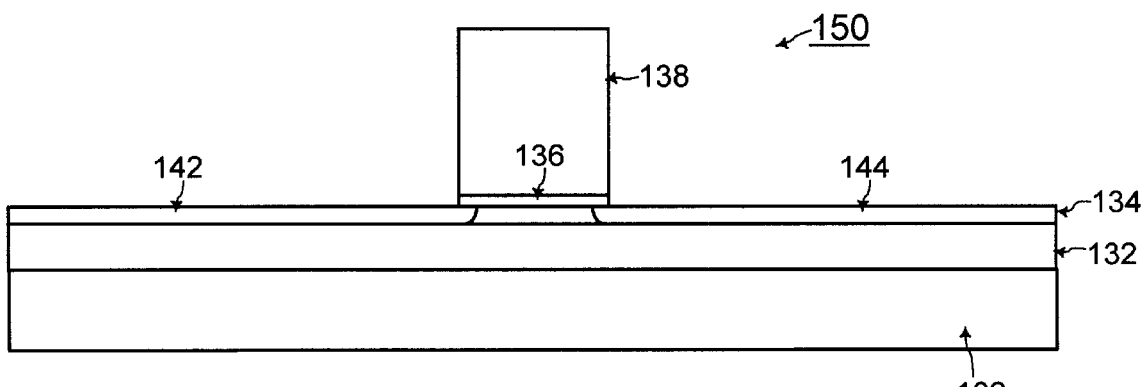
FIG. 2 shows a cross-sectional view of a conventional MOSFET (Metal Oxide Semiconductor Field Effect Transistor) formed within a thin semiconductor film in SOI (semiconductor on insulator) technology.
Figure 3:
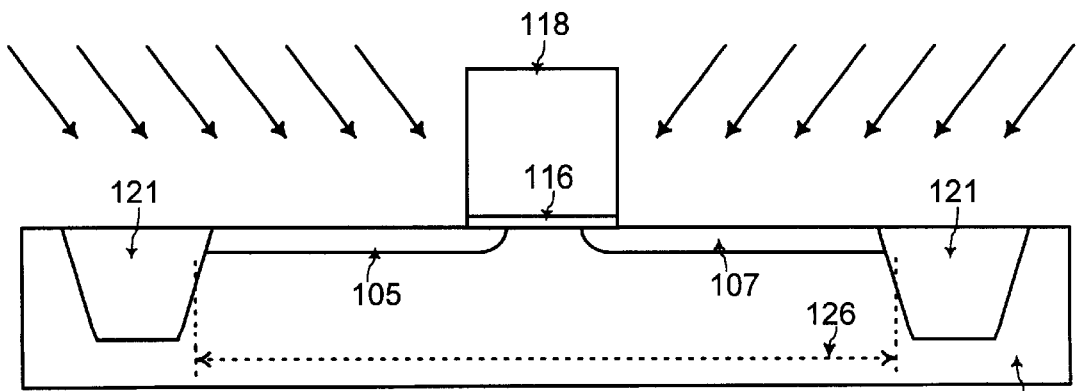
FIG. 3 illustrates bombardment of implantation ions against the doped gate electrode of the MOSFET of FIGS. 1 or 2, especially during an angled implantation process, to disadvantageously contaminate the implantation chamber with material of the doped gate electrode, according to the prior art.
Figure 4:
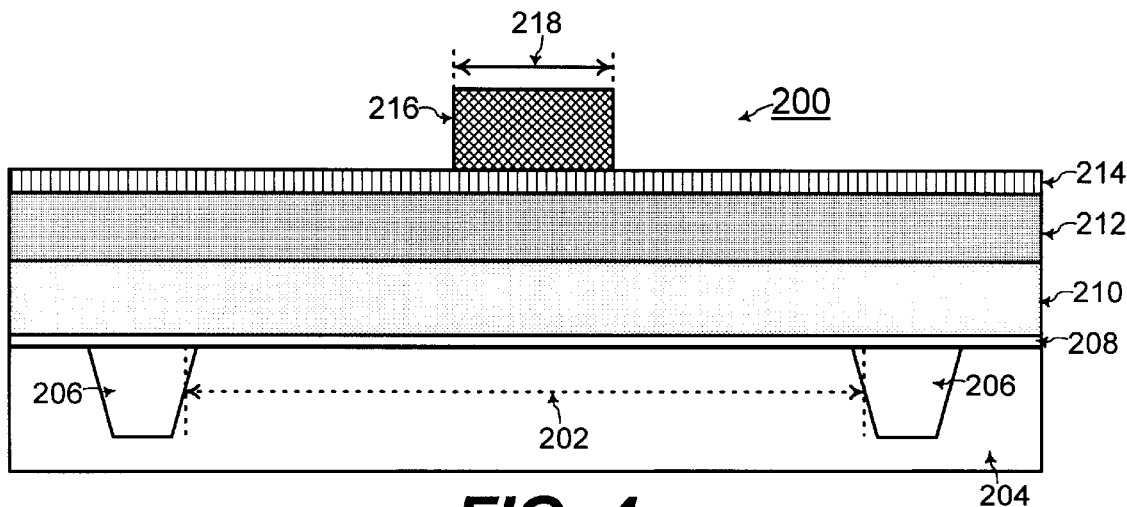
FIGS. 4, 5, 6, 7, 8, 9, 10, 11, 12, 13, and 14 show cross-sectional views for illustrating the steps for fabricating a MOSFET (Metal Oxide Semiconductor Field Effect Transistor) with a doped gate electrode, including forming liner dielectric structures at the sidewalls of the doped gate electrode and forming an amorphous semiconductor structure and a hardmask structure on top of the doped gate electrode, according to one embodiment of the present invention. Such structures prevent bombardment of implantation ions with the doped gate electrode during an implantation process to prevent contamination of the implantation chamber.

Referring to FIG. 4, a MOSFET (Metal Oxide Semiconductor Field Effect Transistor) 200 of an example embodiment of the present invention is fabricated within an active device area 202 of a semiconductor substrate 204 defined by shallow trench isolation structures 206. Processes for formation of shallow trench isolation structures for electrically isolating integrated circuit devices within a semiconductor substrate are known to one of ordinary skill in the art of integrated circuit fabrication. The semiconductor substrate 204 is typically comprised of silicon.

Referring to FIG. 4, a layer of gate dielectric material 208 is formed on the semiconductor substrate 204. The layer of gate dielectric material 208 is comprised of silicon dioxide ($SiO_2$) or silicon nitride ($Si_3N_4$) in one embodiment of the present invention. In an alternative embodiment of the present invention, the gate dielectric material 208 is comprised of a high dielectric constant material having a dielectric constant that is higher than the dielectric constant of silicon dioxide ($SiO_2$) to minimize undesired tunneling current through the gate dielectric of the MOSFET 200. Processes for depositing such a layer of gate dielectric material 208 are known to one of ordinary skill in the art of integrated circuit fabrication.

In addition, a layer of doped gate electrode material 210 is deposited on the layer of gate dielectric material 208 for forming the doped gate electrode of the MOSFET 200. In one embodiment of the present invention, the layer of doped gate electrode material 210 is comprised of silicon doped with germanium and having a germanium concentration in a range of from about 10 atomic percent to about 60 atomic percent (i.e., silicon germanium (SiGe)). In one embodiment of the present invention, such a layer of doped gate electrode material 210 has a thickness in a range of from about 300 angstroms to about 500 angstroms. Processes for depositing such a layer of doped gate electrode material 210 are known to one of ordinary skill in the art of integrated circuit fabrication.

Further referring to FIG. 4, a layer of amorphous semiconductor material 212 is deposited on the layer of doped gate electrode material 210. In one embodiment of the present invention, when the layer of doped gate electrode material 210 is comprised of silicon germanium, the layer of amorphous semiconductor material 212 is comprised of amorphous silicon having a thickness in a range of from about 1,000 angstroms to about 2,000 angstroms. Processes for depositing such a layer of amorphous semiconductor material 212 are known to one of ordinary skill in the art of integrated circuit fabrication.

Furthermore, a layer of hardmask dielectric material 214 is deposited on the layer of amorphous semiconductor material 212. In one embodiment of the present invention, when the layer of amorphous semiconductor material 212 is comprised of amorphous silicon, the layer of hardmask dielectric material 214 is comprised of silicon nitride ($Si_3N_4$) having a thickness in a range of from about 150 angstroms to about 300 angstroms. Processes for depositing such a layer of hardmask dielectric material 214 are known to one of ordinary skill in the art of integrated circuit fabrication.

Further referring to FIG. 4, a layer of masking material, such as photoresist material, is deposited and patterned to form a masking structure 216. In one embodiment of the present invention, the masking structure 216 has a width 218 in the range of from about 50 nanometers to about 300 nanometers. Processes for depositing and patterning photoresist material to form such a masking structure 216 are known to one of ordinary skill in the art of integrated circuit fabrication.

Figure 5:
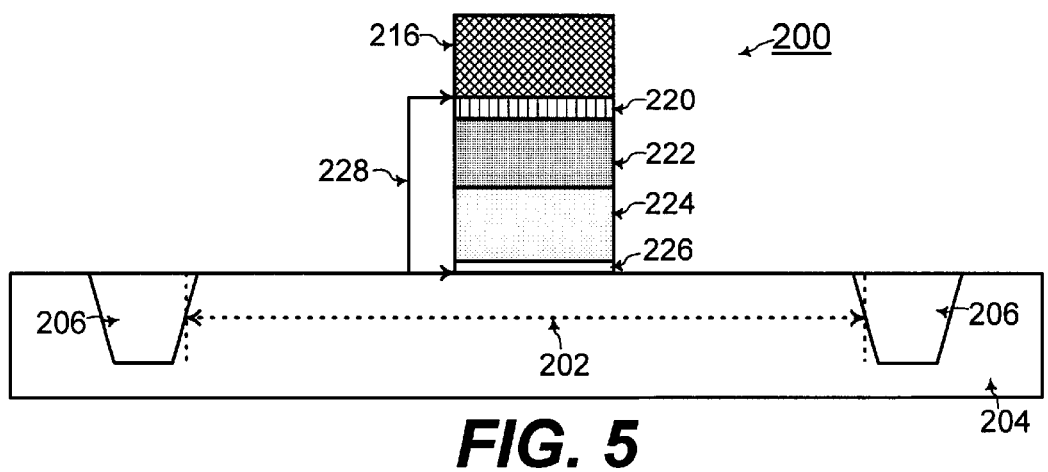

Referring to FIGS. 4 and 5, any region of the layer of hardmask dielectric material 214, the layer of amorphous semiconductor material 212, the layer of doped gate electrode material 210, and the layer of gate dielectric material 208, not under the masking structure 216 is etched away. The hardmask dielectric material 214 remaining under the masking structure 216 forms a hardmask structure 220. The amorphous semiconductor material 212 remaining under the hardmask structure 220 forms an amorphous semiconductor structure 222. The doped gate electrode material 210 remaining under the amorphous semiconductor structure 222 forms a doped gate electrode 224 of the MOSFET 200. The gate dielectric material 208 remaining under the doped gate electrode 224 forms a gate dielectric 226 of the MOSFET. The gate dielectric 226, the doped gate electrode 224, the amorphous semiconductor structure 222, and the hardmask structure 220 form a gate stack 228. Processes for etching the hardmask dielectric material 214, the amorphous semiconductor material 212, the doped gate electrode material 210, and the gate dielectric material 208 are known to one of ordinary skill in the art of integrated circuit fabrication.

Figure 6:
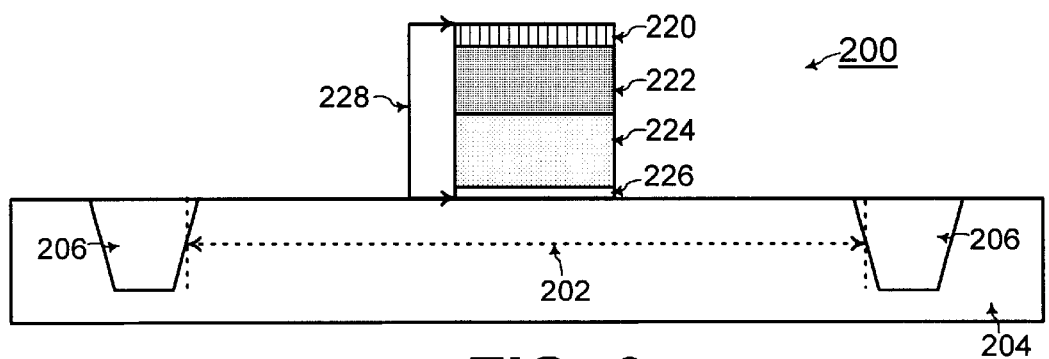

Referring to FIGS. 5 and 6, the masking structure 216 is etched away to leave the gate stack 228. Processes for etching away the masking structure 216, which may be comprised of photoresist material, are known to one of ordinary skill in the art of integrated circuit fabrication.

Figure 7:
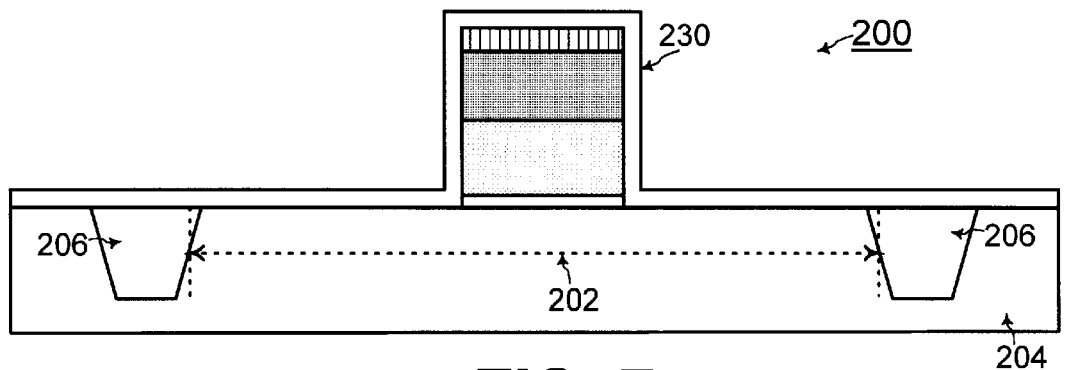

Referring to FIGS. 6 and 7, a layer of liner dielectric material 230 is conformally deposited to cover any exposed surfaces of the gate stack 228. In one embodiment of the present invention, the layer of liner dielectric material 230 is comprised of silicon dioxide ($SiO_2$) having a thickness in a range of from about 100 angstroms to about 200 angstroms. In a preferred embodiment of the present invention, the layer of liner dielectric material 230 is deposited with a CVD (chemical vapor deposition) process using a temperature of less than about 400° Celsius to prevent recrystallization of the amorphous silicon of the amorphous semiconductor structure 222 of the gate stack 228. Such a CVD process for conformally depositing such a layer of liner dielectric material 230 are known to one of ordinary skill in the art of integrated circuit fabrication.

Figure 8:
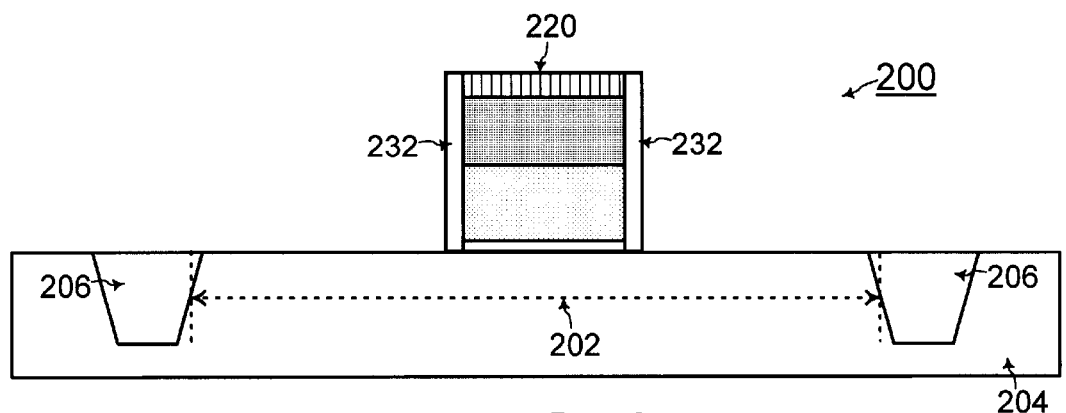

Referring to FIGS. 7 and 8, any portion of the layer of liner dielectric material 230 on a horizontal surface such as on top of the hardmask structure 220 and on top of the semiconductor substrate 204 is etched away in an anisotropic etching process to leave liner dielectric structures 232 on the sidewalls of the gate stack 228. Processes for anisotropically etching the layer of liner dielectric material 230 to leave the liner dielectric structures 232 on the sidewalls of the gate stack 228 are known to one of ordinary skill in the art of integrated circuit fabrication.

The liner dielectric structures 232 on the sidewalls of the gate stack 228 cover the sidewalls of the gate dielectric 226, the doped gate electrode 224, the amorphous semiconductor structure 222, and the hardmask structure 220. In addition, the hardmask structure 220 encapsulates the gate stack 228 at the top of the gate stack 228.

Figure 9:
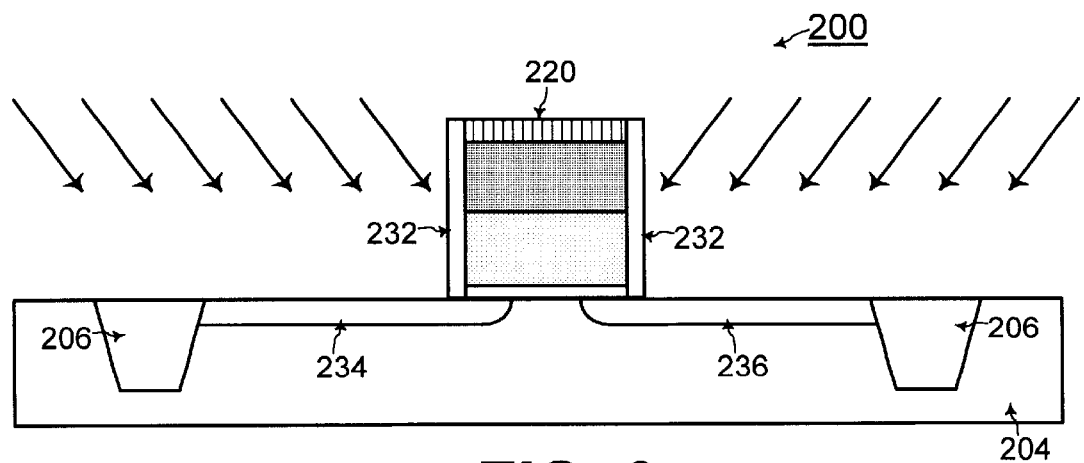

Referring to FIG. 9, for formation of the MOSFET 200, a halo dopant is implanted at an angle toward the sidewalls of the gate stack 228 and into exposed regions of the semiconductor substrate 204 to form a drain halo region 234 and a source halo region 236. Angled implantation processes for implanting the halo dopant for formation of drain and source halo regions of a MOSFET are known to one of ordinary skill in the art of integrated circuit fabrication.

The liner dielectric structures 232 on the sidewalls of the gate stack 228 prevent bombardment of implantation ions comprising the halo dopant against the sidewalls of the doped gate electrode 224 to prevent contamination of the implantation chamber with germanium in FIG. 9. In addition, the amorphous semiconductor structure 222 prevents out-diffusion of the germanium from the doped gate electrode 224, and the hardmask structure 220 ensures encapsulation of germanium to be contained within the gate stack 228 to further prevent contamination of the implantation chamber with germanium in FIG. 9.

Figure 10:
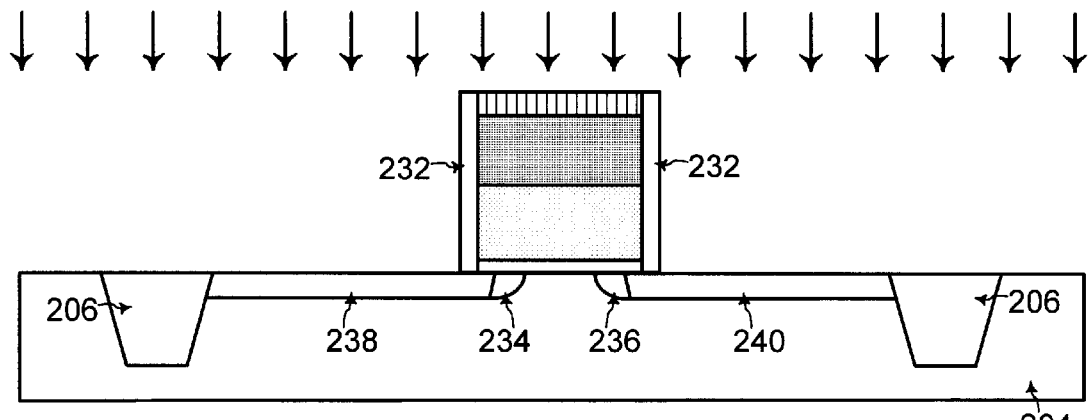

Referring to FIG. 10, a drain and source extension dopant is implanted into exposed regions of the semiconductor substrate 204 using a substantially vertical implantation process to form a drain extension junction 238 and a source extension junction 240. The drain and source extension dopant is an N-type dopant for forming an NMOSFET (N-channel Metal Oxide Semiconductor Field Effect Transistor). Alternatively, the drain and source extension dopant is a P-type dopant for forming a PMOSFET (P-channel Metal Oxide Semiconductor Field Effect Transistor). Processes for substantially vertical implantation of the drain and source extension dopant are known to one of ordinary skill in the art of integrated circuit fabrication.

The halo regions 234 and 236 are implanted with a halo dopant that is opposite in type to the drain and source extension dopant for forming the drain and source extension junctions 238 and 240. For example, when the drain and source extension junctions 238 and 240 are implanted with an N-type dopant for an NMOSFET (N-channel Metal Oxide Semiconductor Field Effect Transistor), the halo regions 234 and 236 are implanted with a P-type dopant for preventing short channel effects of the NMOSFET. On the other hand, when the drain and source extension junctions 238 and 240 are implanted with a P-type dopant for a PMOSFET (P-channel Metal Oxide Semiconductor Field Effect Transistor), the halo regions 234 and 236 are implanted with an N-type dopant for preventing short channel effects of the PMOSFET. Such halo regions 234 and 236 are known to one of ordinary skill in the art of integrated circuit fabrication.

Figure 11:
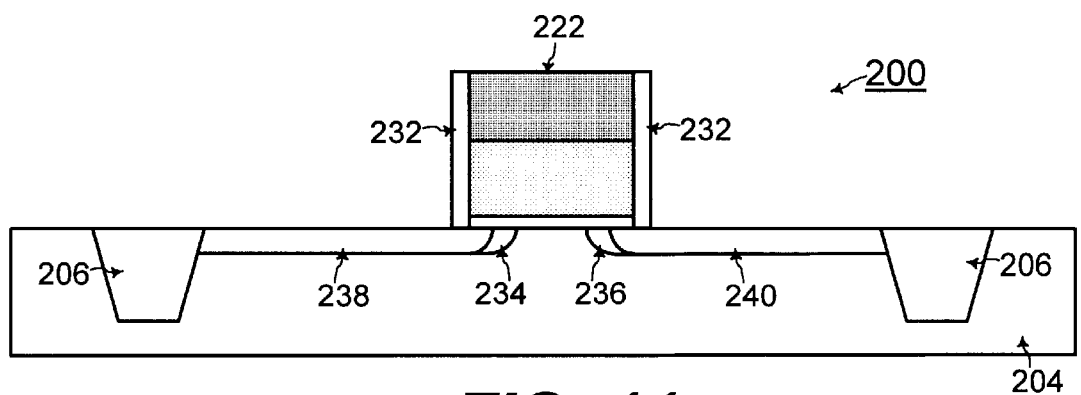

Referring to FIGS. 10 and 11, the hardmask structure 220 is removed from the top of the gate stack 238. When the hardmask structure 220 is comprised of silicon nitride ($Si_3N_4$) for example, the silicon nitride of the hardmask structure 220 is selectively etched away. Processes for etching away such a hardmask structure 220 are known to one of ordinary skill in the art of integrated circuit fabrication.

Figure 12:
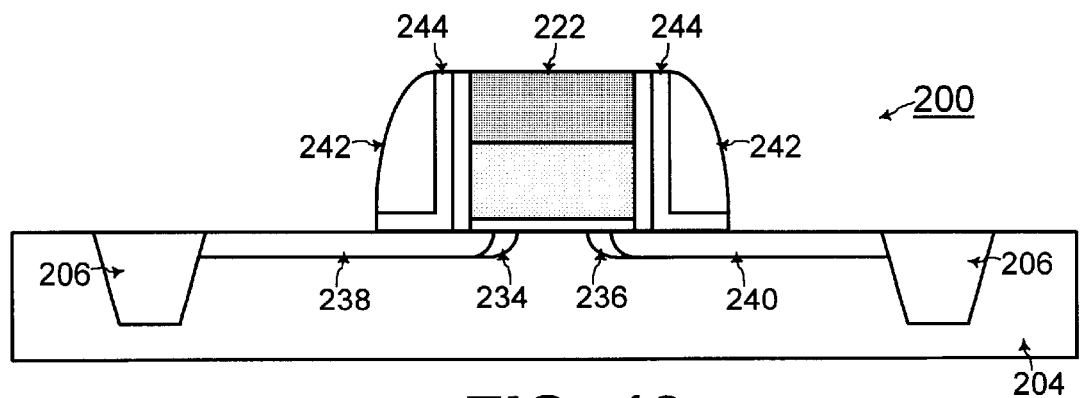

Referring to FIGS. 11 and 12, spacers 242 are formed on the sidewalls of the gate stack 228. When the spacers 242 are comprised of silicon nitride ($Si_3N_4$), a spacer liner oxide 244 is formed as a buffer layer between the spacers 242 and the semiconductor substrate 204 and between the spacers 242 and the liner dielectric structures 232. Processes for forming such spacers 242 and such spacer liner oxide 244 are known to one of ordinary skill in the art of integrated circuit fabrication.

Figure 13:
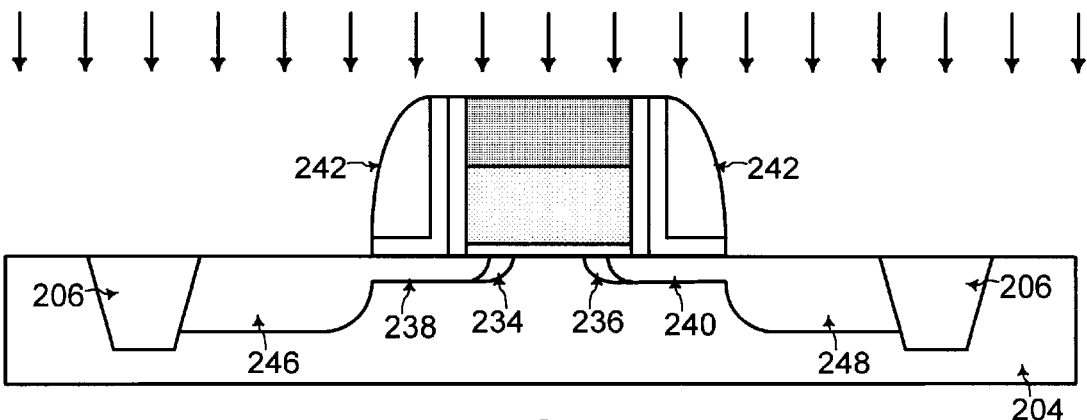

Referring to FIGS. 12 and 13, after formation of the spacers 242, a drain and source contact dopant is implanted into exposed regions of the semiconductor substrate 204 using a substantially vertical implantation process to form a drain contact junction 246 and a source contact junction 248. The drain and source contact dopant is an N-type dopant for forming an NMOSFET (N-channel Metal Oxide Semiconductor Field Effect Transistor). Alternatively, the drain and source contact dopant is a P-type dopant for forming a PMOSFET (P-channel Metal Oxide Semiconductor Field Effect Transistor). The drain and source contact junctions 246 and 248 are fabricated as deeper junctions such that a relatively large size of silicide may be fabricated therein to provide low resistance contact to the drain and the source of the MOSFET 200. Processes for substantially vertical implantation of the drain and source contact dopant are known to one of ordinary skill in the art of integrated circuit fabrication.

Figure 14:
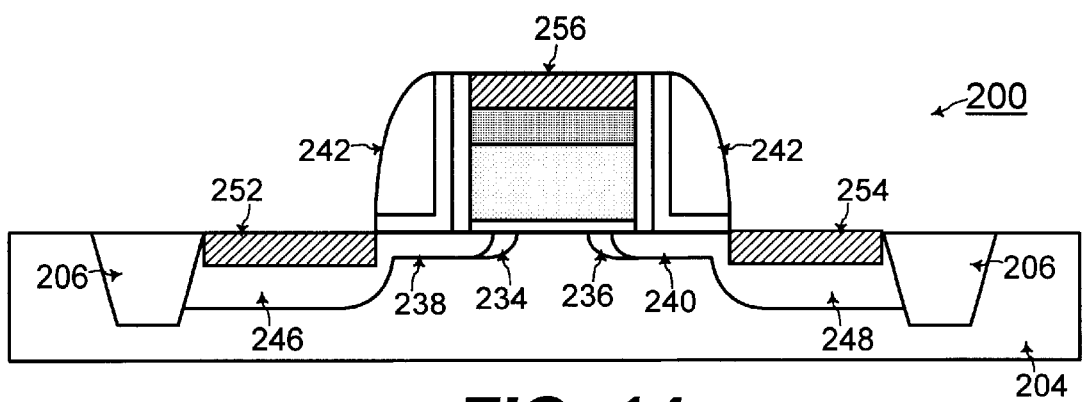

Referring to FIG. 14, a drain silicide 252 is formed within the drain contact junction 246, and a source silicide 254 is formed within the source contact junction 248. In addition, a gate silicide 256 may be formed with the amorphous semiconductor structure 222. Processes for forming the drain and source suicides 252 and 254 and the gate silicide 256 which may be comprised of nickel silicide (NiSi) for example are known to one of ordinary skill in the art of integrated circuit fabrication.

In this manner, the liner dielectric structures 232 on the sidewalls of the gate stack 238 prevent bombardment of implantation ions against the sidewalls of the doped gate electrode 224 to prevent contamination of the implantation chamber. In addition, the amorphous semiconductor structure 222 on top of the doped gate electrode 224 prevents out-diffusion of the germanium from the doped gate electrode 224 since germanium substantially does not diffuse through amorphous silicon. The hardmask structure 220 on the amorphous silicon structure 222 prevents bombardment of implantation ions against the top of a semiconductor material of the gate stack 228 to further prevent contamination of the implantation chamber.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "side wall," and "on" as used herein refer to relative location and orientation of various portions of the structures with respect to one another, and are not intended to suggest that any particular absolute orientation with respect to external objects is necessary or required.

In addition, an example embodiment of the present invention is described for forming a doped gate electrode of a MOSFET with a semiconductor substrate. However, the present invention may also be applied for forming a doped gate electrode of a MOSFET when the semiconductor substrate is a semiconductor film deposited on a buried insulating layer in SOI (semiconductor on insulator) technology, as would be apparent to one of ordinary skill in the art of integrated circuit fabrication from the description herein.

The present invention is limited only as defined in the following claims and equivalents thereof.

I claim:

1. A method for fabricating a field effect transistor on a semiconductor substrate, the method including the steps of:

A. depositing a layer of gate dielectric material on said semiconductor substrate;

B. depositing a layer of doped gate electrode material on said layer of gate dielectric;

C. depositing a layer of amorphous semiconductor material on said layer of doped gate electrode material;

2. The method of claim 1, wherein said layer of doped gate electrode material is comprised of silicon doped with germanium at a concentration in a range of from about 10 atomic percent to about 60 atomic percent of germanium in silicon, and wherein said layer of doped gate electrode material has a thickness in a range of from about 300 angstroms to about 500 angstroms.

3. The method of claim 2, wherein said layer of amorphous semiconductor material is comprised of amorphous silicon having a thickness in a range of from about 1,000 angstroms to about 2,000 angstroms.

4. The method of claim 3, wherein said hardmask material is comprised of silicon nitride ($Si_3N_4$) having a thickness in a range of from about 150 angstroms to about 300 angstroms.

5. The method of claim 4, wherein said liner dielectric structures are comprised of silicon dioxide ($SiO_2$) having a thickness in a range of from about 100 angstroms to about 200 angstroms.

6. The method of claim 5, wherein said liner dielectric structures are formed from a CVD (chemical vapor deposition) process using a temperature of less than about 400° Celsius to prevent recrystallization of said amorphous silicon.

7. The method of claim 1, wherein said gate dielectric material is comprised of one of silicon dioxide ($SiO_2$), silicon nitride ($Si_3N_4$), or a high dielectric constant material having a dielectric constant that is higher than the dielectric constant of silicon dioxide ($SiO_2$).

8. The method of claim 1, wherein said step H further includes the steps of:

implanting a drain and source extension dopant into exposed regions of said semiconductor substrate to form a drain extension junction and a source extension junction of said field effect transistor; and implanting a halo dopant at an angle toward said liner dielectric structures on said sidewalls of said gate stack to form a drain halo region and a source halo region of said field effect transistor.

9. The method of claim 1, further including the steps of:

forming spacers comprised of silicon nitride ($Si_3N_4$) on said sidewalls of said gate stack; and forming additional liner oxide between said spacers and said liner dielectric structures, and between said spacers and said semiconductor substrate.

10. The method of claim 9, further including the steps of:

implanting a drain and source contact dopant into exposed regions of said semiconductor substrate to form a drain contact junction and a source contact junction; and forming a drain silicide in said drain contact junction and a source silicide in said source contact junction.

11. The method of claim 10, further including the steps of:

removing said hardmask structure from said amorphous silicon structure; and forming a gate silicide with said amorphous silicon structure.

12. The method of claim 10, wherein said drain and source extension dopant and said drain and source contact dopant are an N-type dopant for fabrication of an NMOSFET (-channel Metal Oxide Semiconductor Field Effect Transistor).

13. The method of claim 10, wherein said drain and source extension dopant and said drain and source contact dopant are a P-type dopant for fabrication of a PMOSFET (P-channel Metal Oxide Semiconductor Field Effect Transistor).

14. A method for fabricating a MOSFET (metal oxide semiconductor field effect transistor) on a semiconductor substrate, the method including the steps of:

A. depositing a layer of gate dielectric material on said semiconductor substrate;
      wherein said gate dielectric material is comprised of one of silicon dioxide ($SiO_2$), silicon nitride ($Si_3N_4$), or a high dielectric constant material having a dielectric constant that is higher than the dielectric constant of silicon dioxide ($SiO_2$);

B. depositing a layer of doped gate electrode material on said layer of gate dielectric;
      wherein said layer of doped gate electrode material is comprised of silicon doped with germanium at a concentration in a range of from about 10 atomic percent to about 60 atomic percent of germanium in silicon, and wherein said layer of doped gate electrode material has a thickness in a range of from about 300 angstroms to about 500 angstroms;

C. depositing a layer of amorphous semiconductor material on said layer of doped gate electrode material;
      wherein said layer of amorphous semiconductor material is comprised of amorphous silicon having a thickness in a range of from about 1,000 angstroms to about 2,000 angstroms;

D. depositing a layer of hardmask dielectric material on said layer of amorphous semiconductor material;
      wherein said hardmask material is comprised of silicon nitride ($Si_3N_4$) having a thickness in a range of from about 150 angstroms to about 300 angstroms;

E. patterning a masking material to form a masking structure and etching away any portion of said layer of hardmask dielectric material, said layer of amorphous semiconductor material, said layer of doped gate electrode material, and said layer of gate dielectric material, not under said masking structure;
  wherein said hardmask dielectric material remaining under said masking structure forms a hardmask structure;
  wherein said amorphous semiconductor material remaining under said hardmask structure forms an amorphous semiconductor structure;
  wherein said doped gate electrode material remaining under said amorphous semiconductor structure forms a doped gate electrode of said MOSFET;
  wherein said gate dielectric material remaining under said doped gate electrode forms a gate dielectric of said MOSFET;
  wherein said gate dielectric material not under said masking structure is completely etched away such that said semiconductor substrate not under said masking structure is exposed;
  and wherein said gate dielectric, said doped gate electrode, said amorphous semiconductor structure, and said hardmask structure form a gate stack;

F. removing said masking structure from top of said hardmask structure;

G. forming liner dielectric structures on sidewalls of said gate stack including on sidewalls of said gate dielectric, wherein said liner dielectric structures remain only on said sidewalls of said gate stack such that said semiconductor substrate not under said gate stack is exposed and such that said hardmask structure is exposed;
  wherein said liner dielectric structures are comprised of silicon dioxide ($SiO_2$) having a thickness in a range of from about 100 angstroms to about 200 angstroms;
  and wherein said liner dielectric structures are formed from a CVD (chemical vapor deposition) process using a temperature of less than about 400° Celsius to prevent recrystallization of said amorphous silicon;

H. implanting a dopant into exposed regions of said semiconductor substrate after said step G, wherein said step H includes the steps of:
  implanting a drain and source extension dopant into exposed regions of said semiconductor substrate to form a drain extension junction and a source extension junction of said MOSFET; and
  implanting a halo dopant at an angle toward said liner dielectric structures on said sidewalls of said gate stack to form a drain halo region and a source halo region of said MOSFET;

I. forming spacers comprised of silicon nitride ($Si_3N_4$) on said sidewalls of said gate stack;

J. forming additional liner oxide between said spacers and said liner dielectric structures, and between said spacers and said semiconductor substrate;

K. implanting a drain and source contact dopant into exposed regions of said semiconductor substrate to form a drain contact junction and a source contact junction;
  wherein said drain and source extension dopant and said drain and source contact dopant are an N-type dopant for fabrication of an NMOSFET (N-channel Metal Oxide Semiconductor Field Effect Transistor);
  and wherein said drain and source extension dopant and said drain and source contact dopant are a P-type dopant for fabrication of a PMOSFET (P-channel Metal Oxide Semiconductor Field Effect Transistor);

L. forming a drain silicide in said drain contact junction and a source silicide in said source contact junction;

M. removing said hardmask structure from said amorphous silicon structure; and

N. forming a gate silicide with said amorphous silicon structure.

* * * * *

UNITED STATES PATENT AND TRADEMARK OFFICE
CERTIFICATE OF CORRECTION

PATENT NO. : 6,432,763 B1
DATED : August 13, 2002
INVENTOR(S) : Bin Yu

It is certified that error appears in the above-identified patent and that said Letters Patent is hereby corrected as shown below:

Column 9,
Line 28, claim 1 should read as follows to include the additional text after "step C":

1.    A method for fabricating a field effect transistor on a semiconductor substrate, the method including the steps of:
    A. depositing a layer of gate dielectric material on said semiconductor substrate;
    B. depositing a layer of doped gate electrode material on said layer of gate dielectric;
    C. depositing a layer of amorphous semiconductor material on said layer of doped gate electrode material;
    D. depositing a layer of hardmask dielectric material on said layer of amorphous semiconductor material;
    E. patterning a masking material to form a masking structure and etching away any portion of said layer of hardmask dielectric material, said layer of amorphous semiconductor material, said layer of doped gate electrode material, and said layer of gate dielectric material, not under said masking structure;
    wherein said hardmask dielectric material remaining under said masking structure forms a hardmask structure;
    wherein said amorphous semiconductor material remaining under said hardmask structure forms an amorphous semiconductor structure;
    wherein said doped gate electrode material remaining under said amorphous semiconductor structure forms a doped gate electrode of said field effect transistor;
    wherein said gate dielectric material remaining under said doped gate electrode forms a gate dielectric of said field effect transistor;
    wherein said gate dielectric material not under said masking structure is completely etched away such that said semiconductor substrate not under said masking structure is exposed;
    and wherein said gate dielectric, said doped gate electrode, said amorphous semiconductor structure, and said hardmask structure form a gate stack;

UNITED STATES PATENT AND TRADEMARK OFFICE
CERTIFICATE OF CORRECTION

PATENT NO. : 6,432,763 B1
DATED : August 13, 2002
INVENTOR(S) : Bin Yu

It is certified that error appears in the above-identified patent and that said Letters Patent is hereby corrected as shown below:

F. removing said masking structure from top of said hardmask structure;
      G. forming liner dielectric structures on sidewalls of said gate stack including on sidewalls of said gate dielectric, wherein said liner dielectric structures remain only on said sidewalls of said gate stack such that said semiconductor substrate not under said gate stack is exposed and such that said hardmask structure is exposed; and
      H. implanting a dopant into exposed regions of said semiconductor substrate after said step G.

Signed and Sealed this

Fifth Day of November, 2002

*Attest:*

*Attesting Officer*

JAMES E. ROGAN
*Director of the United States Patent and Trademark Office*